United States Patent
Tsironis

(10) Patent No.: US 11,158,921 B1
(45) Date of Patent: *Oct. 26, 2021

(54) FAST IMPEDANCE TUNER CALIBRATION

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/787,750

(22) Filed: Feb. 11, 2020

Related U.S. Application Data

(60) Provisional application No. 62/805,033, filed on Feb. 13, 2019.

(51) Int. Cl.
| | |
|---|---|
| *G01R 21/00* | (2006.01) |
| *G01R 27/04* | (2006.01) |
| *H01P 3/02* | (2006.01) |
| *H01P 1/00* | (2006.01) |
| *H03H 7/38* | (2006.01) |

(52) U.S. Cl.
CPC . *H01P 3/02* (2013.01); *H01P 1/00* (2013.01)

(58) Field of Classification Search
CPC ........ G01R 27/00; G01R 27/04; G01R 27/06; G01R 35/00; H03H 7/38; H03H 7/40
See application file for complete search history.

(56) References Cited

U.S. PATENT DOCUMENTS

| | | | | |
|---|---|---|---|---|
| 7,053,628 B1 * | 5/2006 | Tsironis | ................ | G01R 27/32 |
| | | | | 324/637 |
| 7,135,941 B1 | 11/2006 | Tsironis | | |
| 7,248,866 B1 * | 7/2007 | Tsironis | ................ | G01R 27/32 |
| | | | | 324/642 |
| 8,410,862 B1 * | 4/2013 | Tsironis | ................... | H01P 5/04 |
| | | | | 333/17.3 |
| 9,625,556 B1 * | 4/2017 | Tsironis | ............... | G01R 35/005 |

OTHER PUBLICATIONS

Load Pull [online] Wikipedia [Retrieved Nov. 18, 2016] Retrieved from Internet <URL: http://en.wikipedia.org/wiki/Load_pull>.
"Computer Controlled Microwave Tuner, CCMT", Product Note 41, Focus Microwaves Inc. 1998, pp. 2-4.
"Three-Probe Tuners Tackles Multiple Tasks", Microwaves & RF Magazine, Feb. 2005, p. 90ff.
Behavioral Modeling [online], Brochure Focus Microwaves [Retrieved Feb. 13, 2019], Retrieved from Internet <URL: https://focus-microwaves.com/wp-content/uploads/2018/05/Product-Brochure_Behavioral-Modeling_Focus-Microwaves-Group_2018.pdf>.

* cited by examiner

*Primary Examiner* — Dean O Takaoka

(57) ABSTRACT

A fast calibration method for slide-screw impedance tuners employs a reduced calibration algorithm, which creates appropriately distributed calibration points over the Smith chart compatible with already existing interpolation and tuning algorithms for high accuracy and high-speed impedance tuning. The method uses one vertical scaling of the tuning probe followed by a limited number of vertical positioning operations at pre-set horizontal intervals and applies this data to generate accurate interpolated high-density tuner calibration data points at a fraction of previously required calibration times.

5 Claims, 14 Drawing Sheets

Trajectory K

Trajectory K

Circle P

FAST IMPEDANCE TUNER CALIBRATION

PRIORITY CLAIM

This application claims priority on provisional application 62/805,033, titled "Fast Impedance Tuner Calibration", filed on Feb. 13, 2019.

CROSS-REFERENCE TO RELATED ARTICLES

1. Load Pull [online] Wikipedia [Retrieved 2016 Nov. 18] Retrieved from Internet <URL: http://en.wikipedia.org/wiki/Load_pull>
2. "Computer Controlled Microwave Tuner, CCMT", Product Note 41, Focus Microwaves Inc. 1998, pages 2-4.
3. Tsironis C, U.S. Pat. No. 7,135,941, "Triple probe automatic slide screw tuner and method"
4. "Three-Probe Tuners Tackles Multiple Tasks", Microwaves & RF Magazine, February 2005, page 90ff.
5. Behavioral Modeling [online], Brochure Focus Microwaves [Retrieved 2019 Feb. 13], Retrieved from Internet <URL: https://focus-microwaves.com/wp-content/uploads/2018/05/Product-Brochure_Behavioral-Modeling_Focus-Microwaves-Group_2018.pdf>.

BACKGROUND OF THE INVENTION

This invention relates to automatic microwave impedance tuners used in load pull testing of microwave power transistors (see ref. 1); the tuners (see ref. 2 to 4) synthesize reflection factors (or impedances) and match the transistors (device under test, or DUT) at the input and output of the DUT's at the fundamental and harmonic frequencies.

Modern design of high-power microwave amplifiers, oscillators and other active components used in various communication systems requires accurate knowledge of the active device's (microwave transistor's) characteristics. In such circuits, it is insufficient for the transistors operating at high power close to saturation, to be described using analytical or numerical models (see ref. 5). Instead the devices need to be characterized under the actual operating conditions using specialized test setups employing tuners and other test equipment.

An efficient method for testing and characterizing transistors for high power operation is "load pull" and "source pull" (see ref. 1 and FIG. 1). Load pull or source pull are measurement techniques employing microwave impedance tuners and other microwave test equipment (FIG. 1), such as signal sources, input and output impedance tuners, RF (Radio Frequency) load, control computer and digital connections between the computer and the tuners and the test equipment. The microwave tuners are used in order to manipulate the RF impedance conditions at the fundamental (Fo) and harmonic (2Fo, 3Fo and possibly higher, see ref. 3) frequencies under which the Device under Test (DUT) is tested.

Electromechanical tuners used in load pull measurements are mostly "slide screw tuners" using a low loss transmission line, typically a slotted airline (slabline) and one (see ref. 1 and FIG. 2) or more (see ref. 4) metallic tuning probes that can be precisely inserted into the slot of the slabline in order to create a controlled reflection factor, or RF impedance (FIG. 5). Electro-mechanical slide screw tuners are especially used for high power load pull testing, because they have several advantages, such as long-term stability, higher handling of RF power, easier operation and lower cost, compared to other types of tuners.

The tuners create controlled impedance in an open loop configuration. This means there is no feed-back information between the stimulus (the impedance set by the tuner) and the measurement. This means the measurement depends on the tuner accuracy, or, the tuner must be calibrated before being used and the calibration data must be saved and recalled during the measurement procedure. This means the tuner must be repeatable, or when directed to generate a given impedance it must be able to do so within a certain accuracy, typically better than 1% (−40 dB). Tuner calibration means the various states of the tuner are measured using a vector network analyzer and the data are saved and retrieved later to be associated with DUT characteristics to create ISO contour plots over the Smith chart.

DESCRIPTION OF PRIOR ART

Tuner calibration, as any calibration, is the process of comparing the device to be calibrated with a calibration standard and saving the data, so they can be recalled and used to correct the value of the raw readings of instruments connected to the device under test (DUT). In the case of electro-mechanical tuners (FIG. 3), calibration is the measurement of the tuner's scattering (s-) parameters using a vector network analyzer (VNA) for a multitude of tuning probe positions and saving in tuner calibration files. For a general-purpose tuner calibration, the probe-positions shall be selected in such a manner as to generate reflection factors covering the whole normalized reflection factor area (the Smith chart). This requires horizontal probe movement (parallel to the slabline) of one half a wavelength ($\lambda/2$) and vertical (perpendicular to the slabline) movement between a state of full withdrawal to a position as close to the center conductor as mechanically controllable, or short before a mechanical contact. The reflection factor generated by the penetration of the probe into the slabline is previously unknown in detail and must be experimentally determined each time. This critical vertical search movement procedure is called "scaling" and determines the probe penetration Y for several reflection factor levels $S_{11}$; once this is done and for each Y=const. setting, a set of horizontal movements from the initialization point (X=0) to X=$\lambda/2$ is executed to create a set of calibration points forming concentric reflection factor circles on the Smith chart (FIG. 5). Since the phase of the reflection factor of a linearly moving obstacle in a transmission line is strictly proportional to the travelled distance X ($\Phi=-4\pi*X/\lambda$), or for X=$\lambda/2$ we get $\Phi=-360°$, it is obvious to assume that, if we know the amplitude of the reflection factor $S_{11}(Y)$ we should be able to calculate all points of each concentric circle with great accuracy, and not have to measure each point. This is true, however only in an ideal case, where the residual reflection (probe fully withdrawn) of the slabline is exactly zero, or $|S_{11}(Y=0)|=0$. This being rarely the case a new method is due.

Slide screw impedance tuners are calibrated using vector network analyzers (VNA), FIG. 2. Calibration occurs at a limited number of settings corresponding to reflection factor points, which are best distributed over the Smith chart. However, in real measurement operation the calibrated points will not allow to tune to every desired impedance, even if the number of calibrated points is higher than 1,000. Only appropriate interpolation between calibrated points allows taking advantage of the high mechanical resolution of the slide screw tuners; a typical electro-mechanical tuner (see ref. 2) can generate millions of impedance states; interpolation, though is accurate enough only when anchored on a dense grid of calibrated points, which leads to the requirement of thousands of calibrated points. And this costs calibration time. In short, tuner calibration time (TCT) is the sum of probe movement (PM) and VNA reading time (RT): TCT=PM+RT. The higher the frequency of operation, the smaller the wavelength λ and the shorter PM, but RT remains constant, since, to acquire the data that cover the Smith chart, the VNA readings must be done anyhow. So, we need either speed up individual data reading or reduce the number of movements and readings.

SUMMARY OF THE INVENTION

This invention discloses a fast tuner calibration algorithm, which allows equivalent tuning accuracy as a full-scale calibration by exploiting the natural behavior of the slide-screw tuners (FIG. 3), i.e. the constant amplitude and linear phase change with horizontal movement of the tuning probe. Because the slotted airlines (slablines) used in real tuners do not have perfect 50 Ohm characteristic, the fast calibration algorithm requires a number of vertical probe-positionings and data to generate the required accuracy. Nevertheless, calibration time reduction by a factor of typically 5 is possible.

BRIEF DESCRIPTION OF THE SEVERAL VIEWS OF THE DRAWINGS

The invention and its mode of operation will be more clearly understood from the following detailed description when read with the appended drawings in which:

FIG. 12A depicts scaling every 120 degrees and FIG. 12B depicts accuracy of interpolated data of generated reflection factor versus full calibration.

FIG. 13A depicts scaling every 60 degrees and FIG. 13B depicts accuracy of interpolated data of generated reflection factor versus full calibration.

FIG. 14A depicts full calibration; FIG. 14B depicts zoom-in of the area around $S_{11}$=1. Crosses are measured points; black dots are calculated fast calibration points based on 60-degree scalings (FIG. 13A).

DETAILED DESCRIPTION OF THE INVENTION

Present tuner calibration routines comprise the following two distinct steps, each including probe movements in the X-Y space with several stops, at which scattering (s-) parameters are retrieved from the VNA, evaluated and saved: (a) an initial vertical scaling and (b) horizontal meandering travel. Scaling regulates the vertical (perpendicular to the slabline axis) probe penetration into the slabline for generating target $|S_{11}|$ values. Horizontal (parallel to the slabline axis) movement creates concentric reflection factor $S_{11}$ calibration point circles. Since the horizontal angular distance between the calibration points follows very accurately the wave reflection law $\Phi=-4*\pi*L/\lambda$ and $\Delta\Phi=-4*\pi*\Delta L/\lambda$ (L being the electrical distance between the test port and the tuning probe) one would expect the phase of $S_{11}$ to be easily and accurately calculated and, since $|S_{11}(Y)|$ would be known from scaling, one would expect the whole calibration space $S_{11}=|S_{11}|*\exp(j\Phi)$ to be calculated accurately without more VNA readings than the one vertical scaling.

Figure 5:
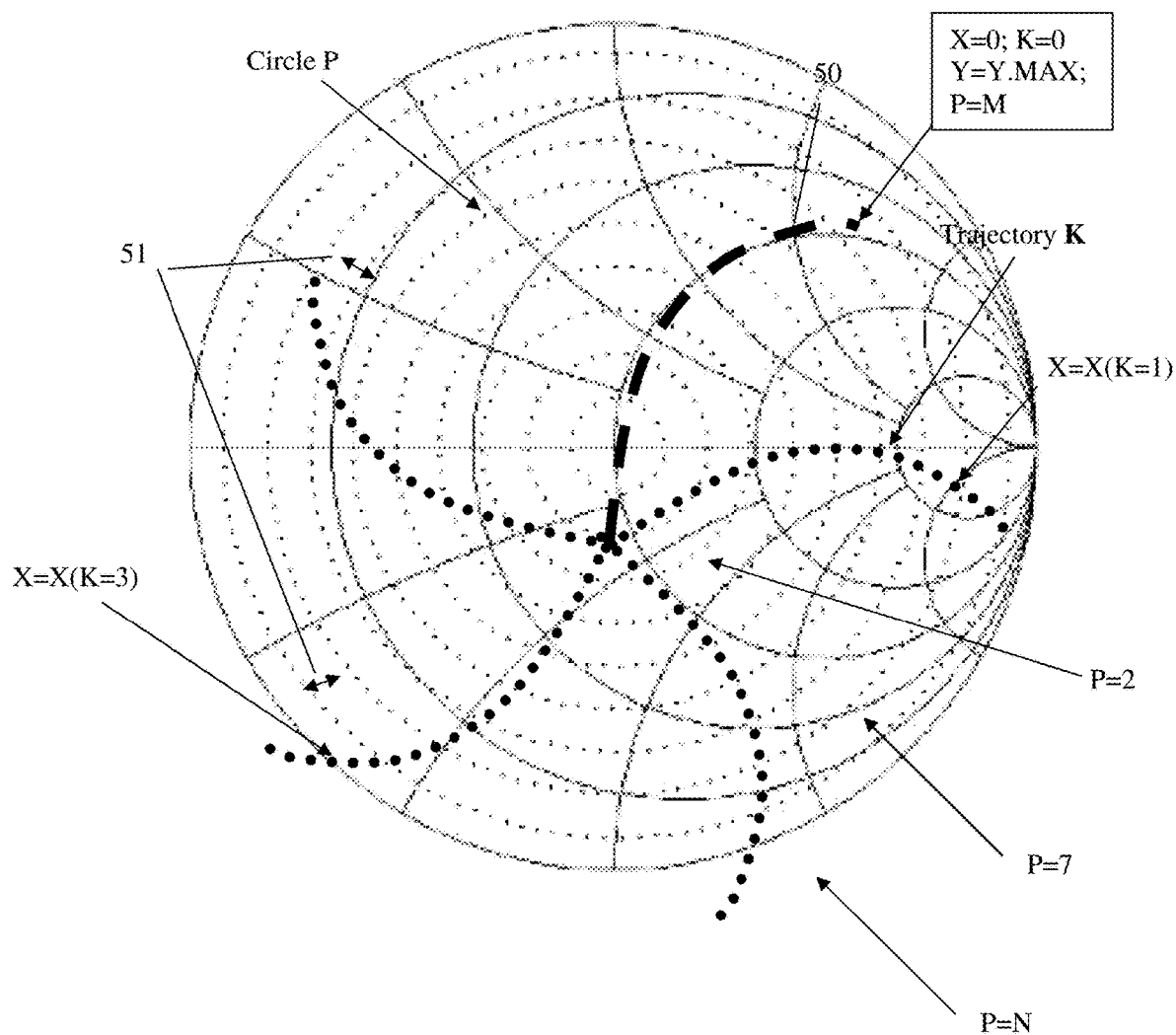
FIG. 5 depicts vertical scaling (50) and probe positioning at several horizontal probe positions (51).

Definitions: To avoid confusion through the following disclosure, it is helpful to clarify the defined and used variables: The reflection factor is designated either as GAMMA or as $S_{11}$, the associated maximum or target values as $S_{11}$.MAX or GAMMA.MAX. In FIG. 5 we index the calibration points (reflection factors $S_{11}$ on concentric circles defined at the tuner test port) as follows: P is the index of each circle, N is the number of circles (0<P≤N), Q defines the number of points per circle, M is the number of vertical trajectories (in traditional calibrations M=1), K is the index of each trajectory. Regarding the tuner itself, all horizontal and vertical positions are defined with the associated control motor steps, wherein the physical size associated with a motor step varies according to the gear mechanism used; for instance horizontal steps vary from 2.5 to 50 micrometers depending on the frequency (the higher the frequency the smaller the step-size) and in vertical direction typical step-sizes are 1 to 2 micrometers: X is the horizontal distance (in motor steps) of the metallic RF tuning probe from a zero reference position (X=0) to X.MAX=(INT)(λ/(2*step-size)), and Y is the level of the RF tuning probe penetration from full withdrawal (Y=0) to Y.MAX, which is the maximum controllable depth before mechanical contact. (INT) signifies an integer number, because λ/2 is a real distance and X are motor steps (corresponding to physical movement depending on the used gear).

Figure 11:
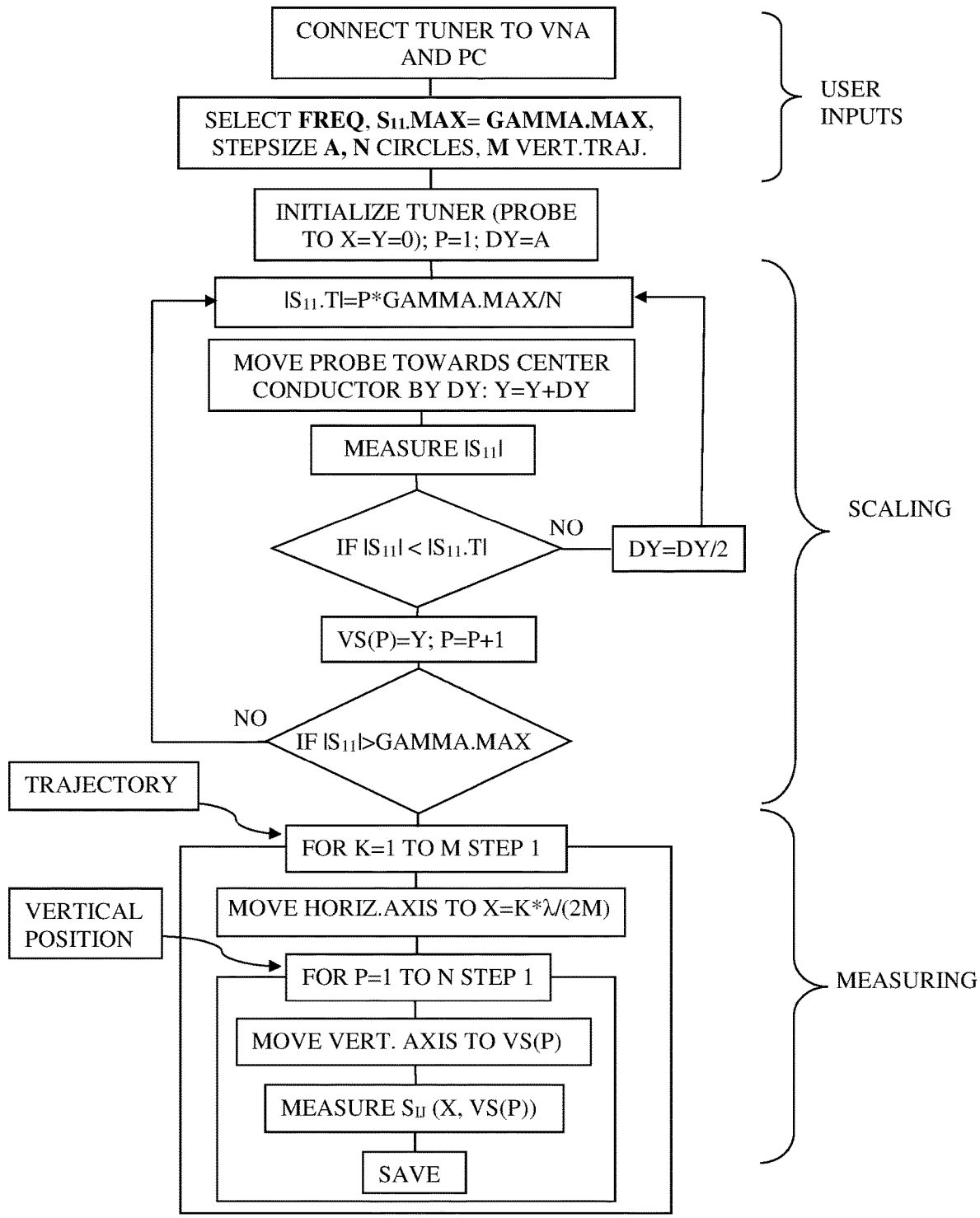
FIG. 11 depicts a flowchart of fast calibration.

Scaling is a critical operation. The calibration algorithm does not know the real behavior of the specific tuner. What is known is the frequency, and the maximum number of vertical control motor steps (corresponding to the penetration of the tuning probe into the slabline) before the probe touches (contacts) the center conductor. We also know that, with increasing penetration the reflection factor increases hyperbolically (the capacitance between the concave tuning probe and center conductor is inversely proportional to the gap between the two). When the probe touches the center conductor the gap is zero and the capacitance becomes infinite, we have a short circuit or $|S_{11}|$=1 (at the probe reference plan); in real life most tuning operations occur in the last ~10% of the tuning range (between $|S_{11}|$=0.85 and 0.95) which corresponds to about 2-3% of the distance between probe withdrawn from the slabline (Y=0) and approximate contact between probe and center conductor (Y=Y.MAX). Or, assuming the maximum vertical position to be Y.MAX=3000 motor steps, all critical measurement operations occur between 2900 and 3000 steps. This inherent nonlinearity requires a very high and accurate positioning resolution and careful definition of the reflection factors as a function of vertical steps. Satisfying this requirement, forms the base allowing accurate interpolation and future high $S_{11}$ tuning at high resolution. The scaling algorithm is shown as part of the flowchart in FIG. 11: after connecting the tuner to a pre-calibrated vector network analyzer (VNA) the user enters: (1) the target $S_{11}$.MAX to be reached at a given frequency or sets of frequencies, (2) the estimated starting vertical number of steps DY=A (typically 100 steps) and (3) the number N of concentric $|S_{11}|$=constant circles to be created (batch calibrations at many frequencies are possible and are a matter of control software and user interface). The number N is one quantity defining the density and number of calibration points. Typical values are N=5 to N=20. If a target $S_{11}$.MAX is not defined or a requested $S_{11}$.MAX cannot be reached, the routine will move the metallic RF tuning probe to the maximum penetration Y=Y.MAX before mechanical contact, (which is a geometrical dimension known for each tuner), and define the measured $S_{11}$ as $S_{11}$.MAX. Then the tuner is initialized, i.e. the probe moves to X=Y=0. At the origin of the Cartesian space X, Y, its coordinates are X=0 (probe usually closest to the DUT i.e. the test port) and Y=0 (probe fully withdrawn). The area covered is 0≤X≤X.MAX (X.MAX corresponding to X=λ/2) and 0≤Y≤Y.MAX or 0≤Y≤Y($S_{11}$.MAX); it is possible that the maximum required $S_{11}$ is reached before the vertical position reaches maximum in which case: Y($S_{11}$.MAX)<Y.MAX.

Following that, the probe is inserted by DY=A steps and $S_{11}$ is measured. If $|S_{11}|$ is smaller than the radius of the first circle $S_{11}$.MAX/N then the probe is inserted further by DY=A/2 steps, $S_{11}$ measured again and, if still $|S_{11}|$<$S_{11}$.MAX/N, the probe is further inserted by DY=A/4 steps and $S_{11}$ is measured again and compared with $S_{11}$.MAX/N; the shrinking vertical stepping continues until $|S_{11}|$ reaches or exceeds $S_{11}$.MAX/N. At this point the vertical position Y(P=1) is saved. In the next step P is increased to P=2 and the target now is 2*$S_{11}$.MAX/N; the procedure is repeated starting with DY=A/2 vertical steps. The routine is repeated up to P=N, each time starting with DY=A/P steps and continuing with A/2P, A/4P etc., in which case either the final reflection factor becomes $S_{11}$.MAX or the probe reaches Y=Y.MAX. This algorithm yields the reflection factor values $S_{11}$(Y(P)), for 1≤P≤N, item (81) in FIG. 8, which means that now we know at what level of probe penetration each concentric reflection factor circle occurs.

In a traditional calibration the probe is set to the successive Y(P) positions (81) and the carriage is moved horizontally (80), (90), (100) in several steps between X=0 and X=X.MAX, scattering (s-) parameters are measured by the VNA and saved in a calibration file. To obtain a homogenous $S_{11}$ point distribution (FIG. 5) over the Smith chart, the number of horizontal points increases with the circle index P based on a rule of thumb Q*P, whereby Q=4, 8, 16 or 32 (that defines how many points are on each circle P, FIG. 5), example, for low density the first circle has 4 points and the 9th circle 36 points, for high density the numbers are 32 and 288, the associated arcs between points at N=9 are 10 and 2.25 degrees. The two numbers N (number of circles) and Q (number of points on each circle) define the density or total number of calibration points, ranging from 180 to 1440 or more. It is obvious that, the higher the density and number of points, however, the higher the number of points, the higher the interpolation accuracy and the longer the calibration procedure lasts.

Figure 6:
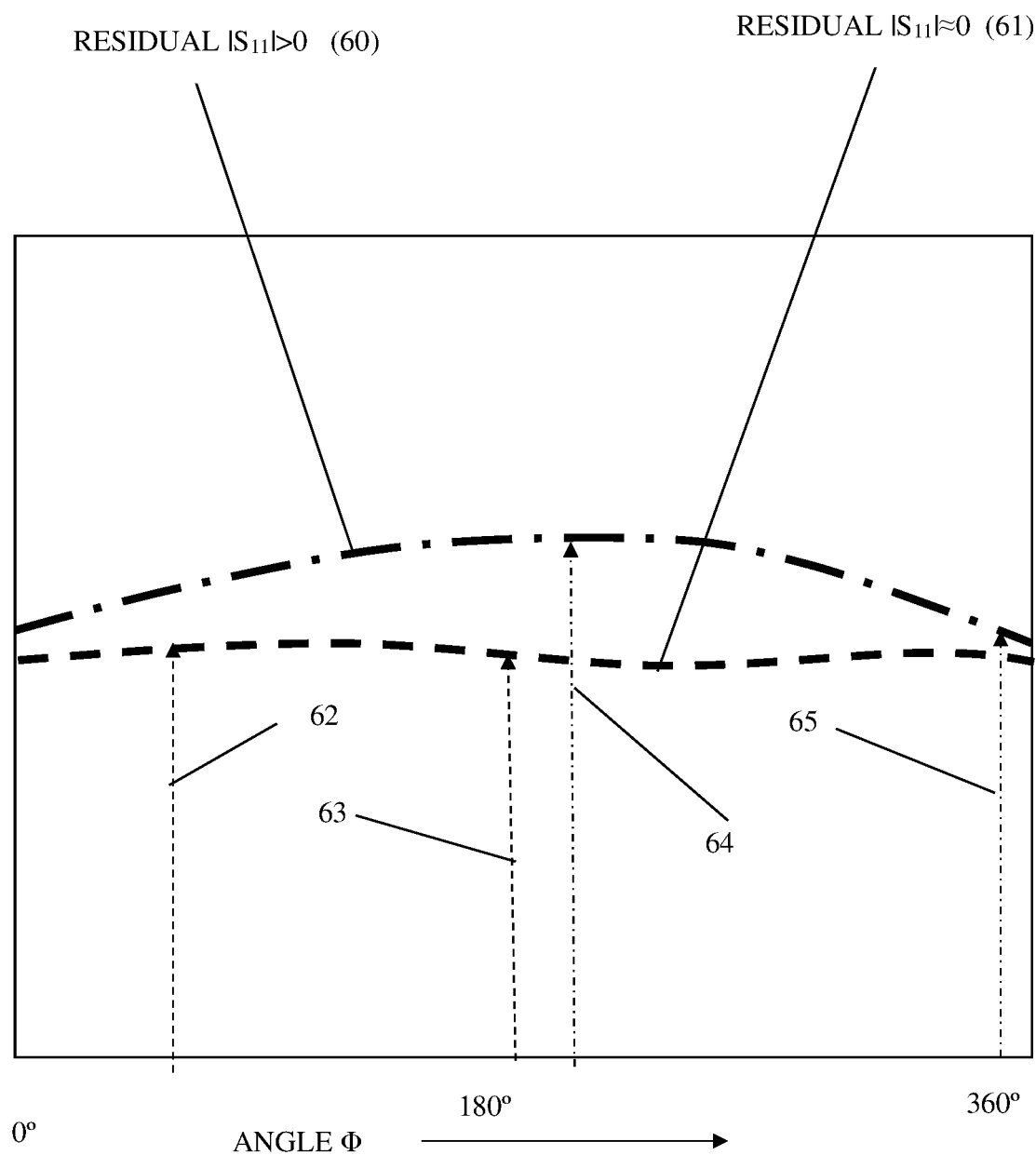
FIG. 6 depicts radius of reflection factor at constant probe depth over λ/2 horizontal travel for a perfect 50 Ohm slabline (61) and a slabline with residual reflection (60).
Figure 7:
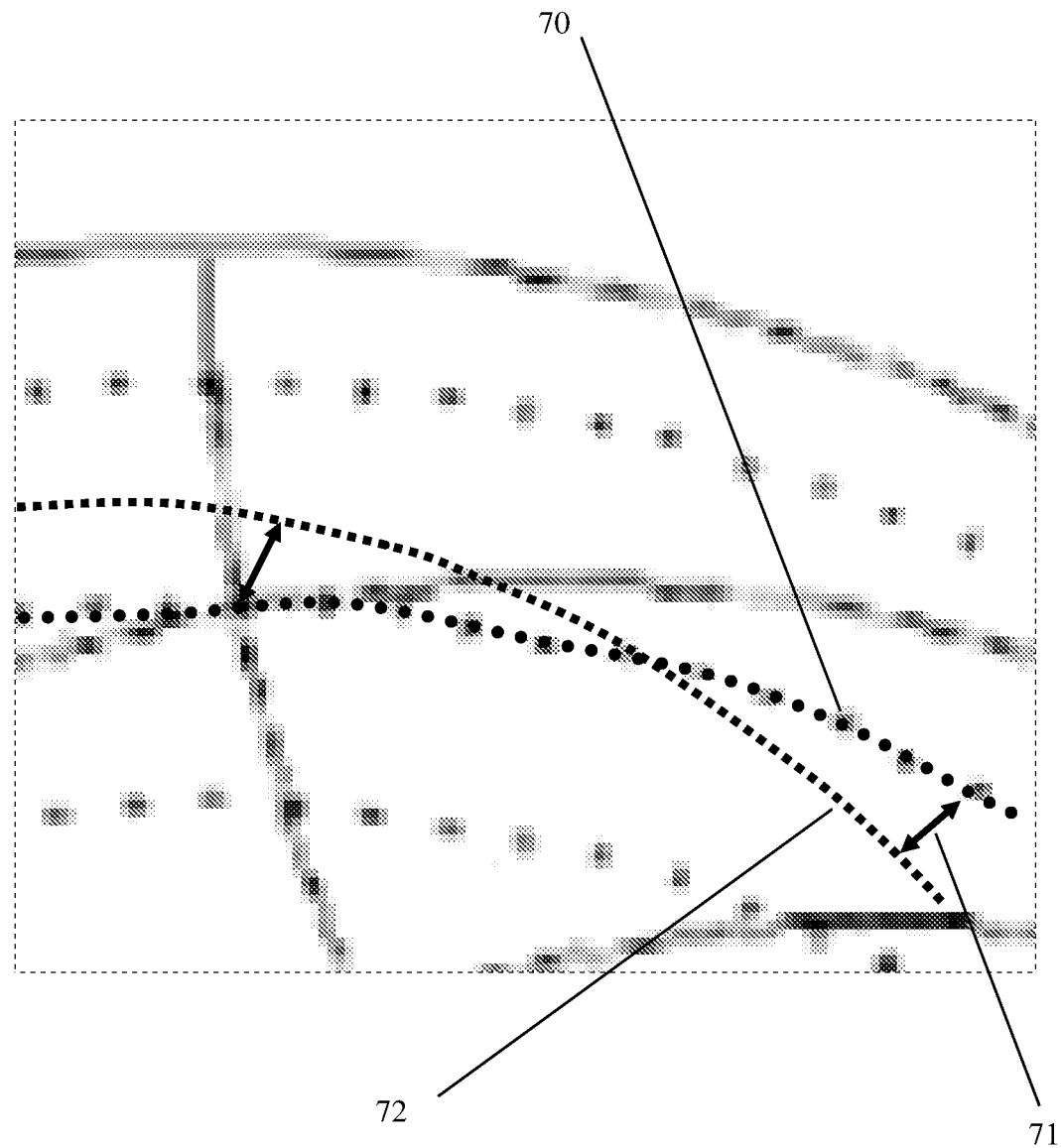
FIG. 7 depicts traces of reflection factor ($S_{11}$) at full calibration versus generated calibration data.

The fast calibration in this invention executes differently; since we know that the phase of the reflection factor is strictly proportional to the physical distance from the test port, or the horizontal position X from zero (X=0), we should be able to calculate all phases of $S_{11}$(X) of all $S_{11}$(Y(P)) circles (72) and finish (FIG. 7). However, if we do this and compare with full calibration data (70), we get sometimes significant deviations (71). The reason is that, even if the horizontally moving probe creates a constant reflection circle (43) in FIG. 4 at its own reference plane (44) around 50Ω, the slabline itself may not be perfect and it adds a small reflection (40) to the probe's own reflection resulting in vector (41); this causes the circles to become eccentric (42). There is no practical method to account for this systemic issue, except for adding more data points, because the small error vector (40) is the result of multiple small reflections distributed along the slabline and appears random as we move the tuning probe, because some small reflections occur before and some after the tuning probe. The typical shape of the resulting reflection factor radii, as a function of horizontal probe position, is shown in FIG. 6.

FIG. 6 depicts a typical trace of the reflection factor amplitude $|S_{11}|$ over a horizontal travel 0≤X≤X.MAX of the tuning probe at constant penetration Y=const. When the slabline has a residual reflection ≈0 the trace is relatively flat (61), or $|S_{11}(X)|$≈const. (62, 63). When the residual reflection is >0 (trace (60)) the reflection factor (64, 65) is not constant, or $|S_{11}(X)|$≠constant. In this case we cannot calculate accurately $|S_{11}(X)|$ from the scaling values at $|S_{11}(X=0)|$.

Figure 8:
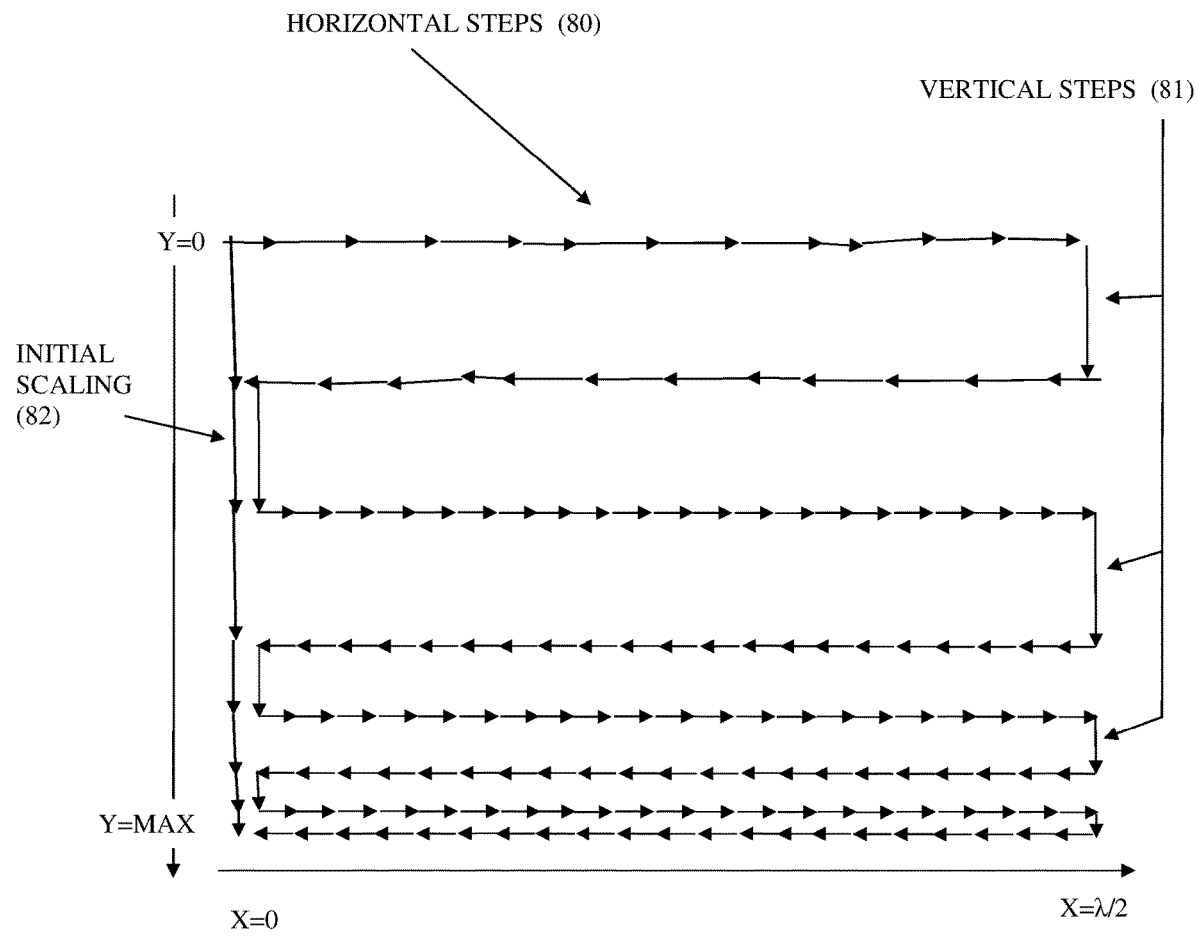
FIG. 8 depicts tuning probe trajectory for full calibration.

The probe trajectory of the prior art calibration is depicted in FIG. 8. Starting from the original initialization point X=Y=0 the routine first executes the Scaling (82). This previously described algorithm determines the vertical position (penetration) Y of the probe, which creates the concentric equidistant reflection factor circles. Because of the hyperbolic $S_{11}$(Y) behavior the vertical sensitivity Δ$|S_{11}|$/ΔY of the points increases with Y, whereas the distance between the "$S_{11}$" circles must remain approximately constant (51) in FIG. 5). On the other hand, and to keep the angular distance between calibration points approximately constant on the Smith chart, the number of horizontal intervals (80) increases with increasing penetration Y and $|S_{11}|$, simply because to keep the same length of the arc at the same angle ΔΦ requires less horizontal steps at higher radius ΔΦ~ΔX*$|S_{11}|$.

Figure 1:
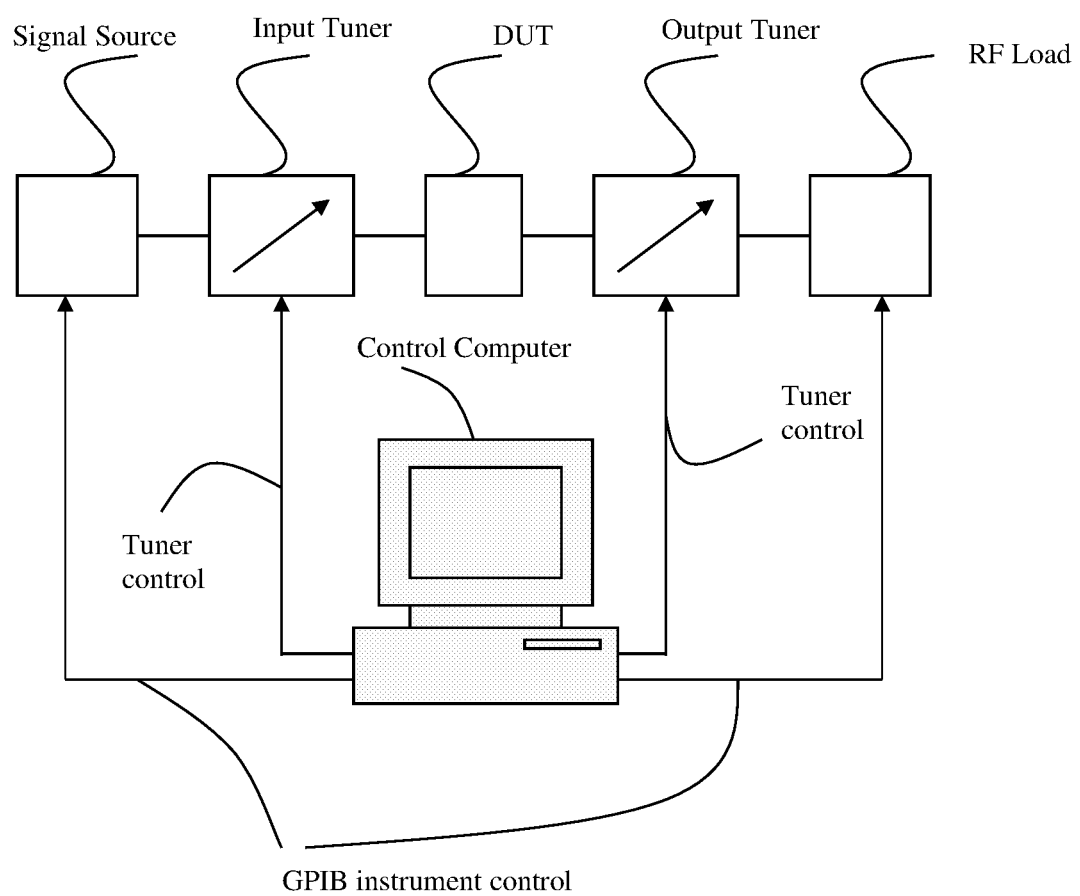
FIG. 1 depicts prior art, a typical load pull system.
Figure 2:
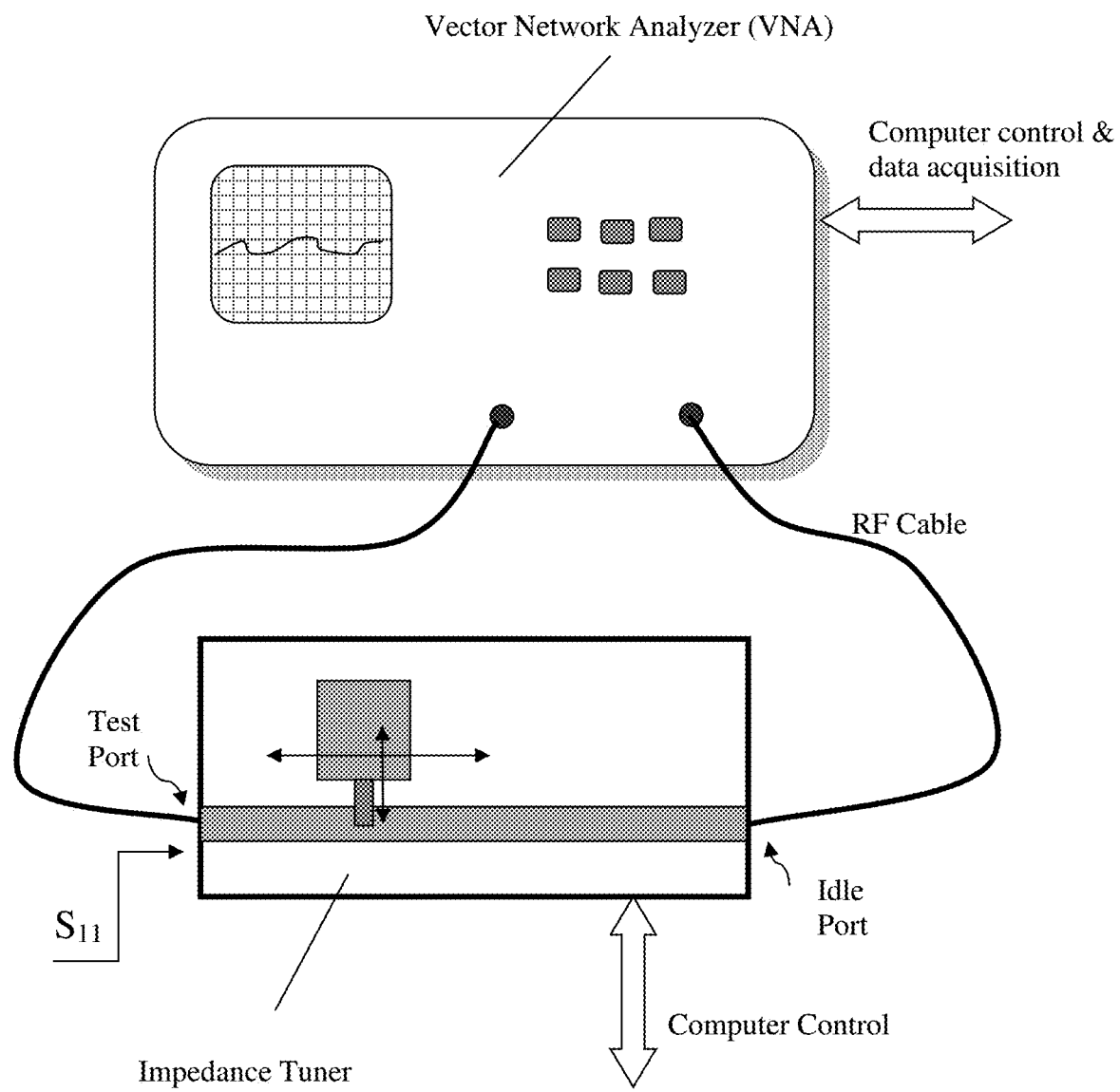
FIG. 2 depicts prior art, tuner connection to VNA for calibration.
Figure 3:
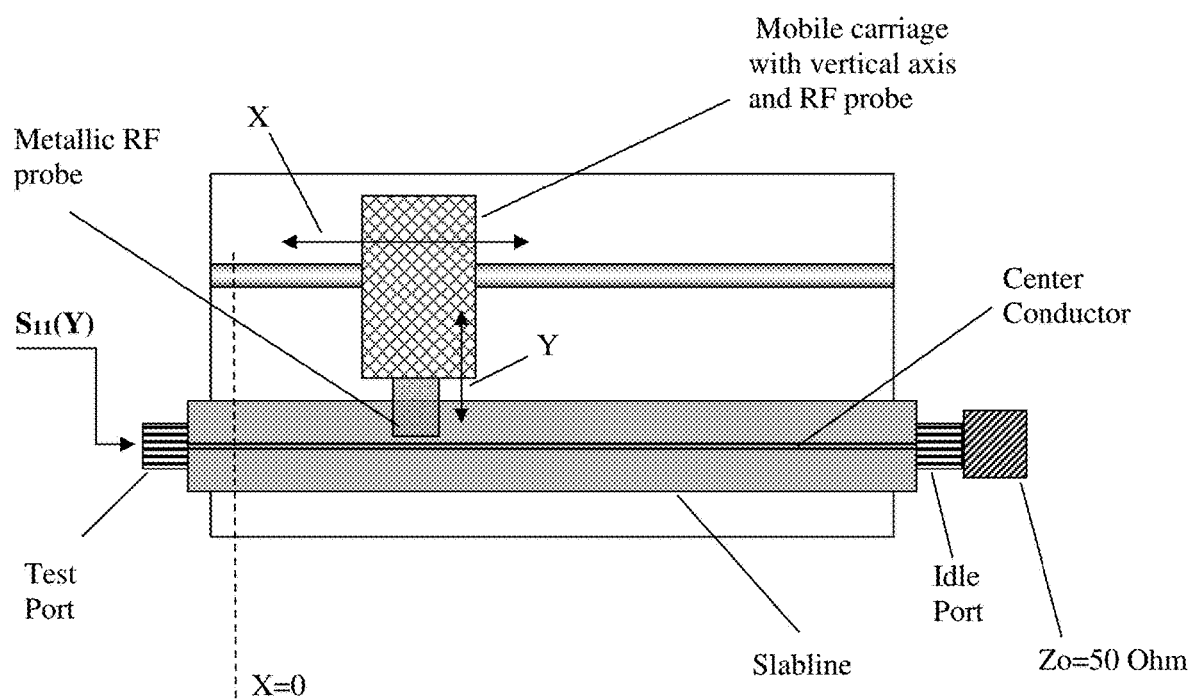
FIG. 3 depicts prior art, single probe slide screw impedance tuner.
Figure 4:
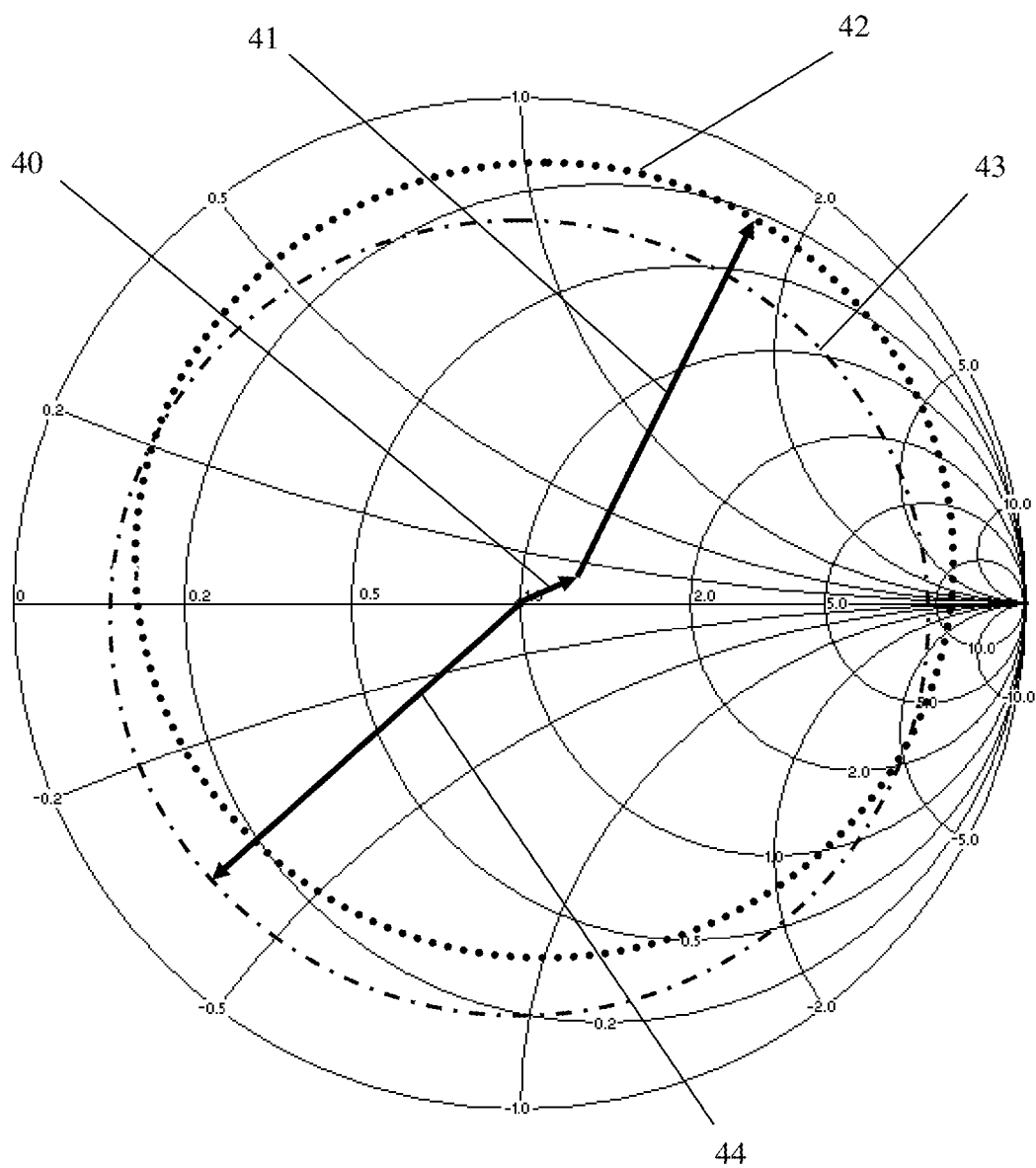
FIG. 4 depicts two scenaria of reflection factor trajectory when the tuning probe travels horizontally at constant depth (a) in a perfect 50 Ohm slabline (44) and (b) in a realistic slabline with some residual reflection (42).
Figure 9:
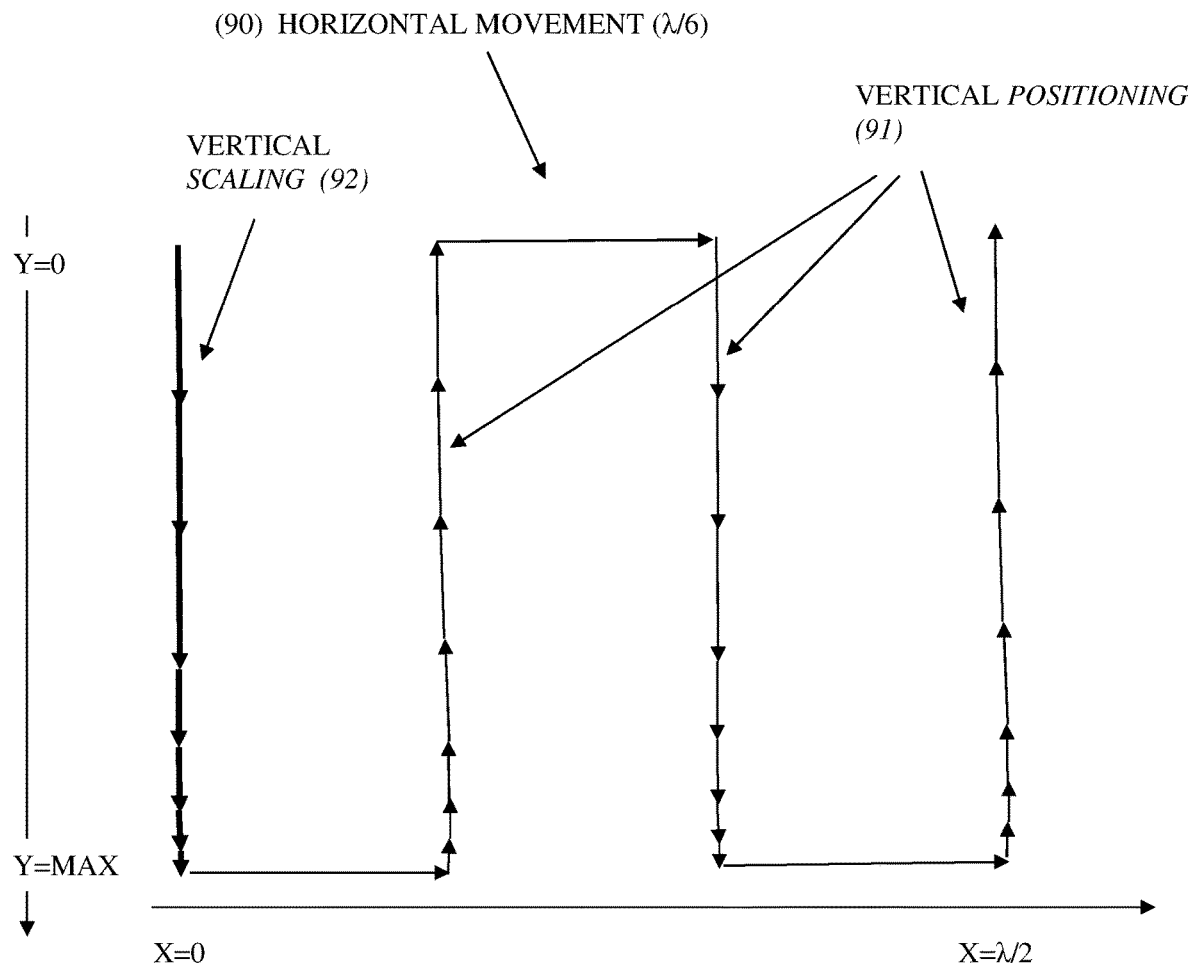
FIG. 9 depicts tuning probe trajectory for fast calibration with vertical positioning every 120 degrees (X=λ/6, λ/3, λ/2).
Figure 10:
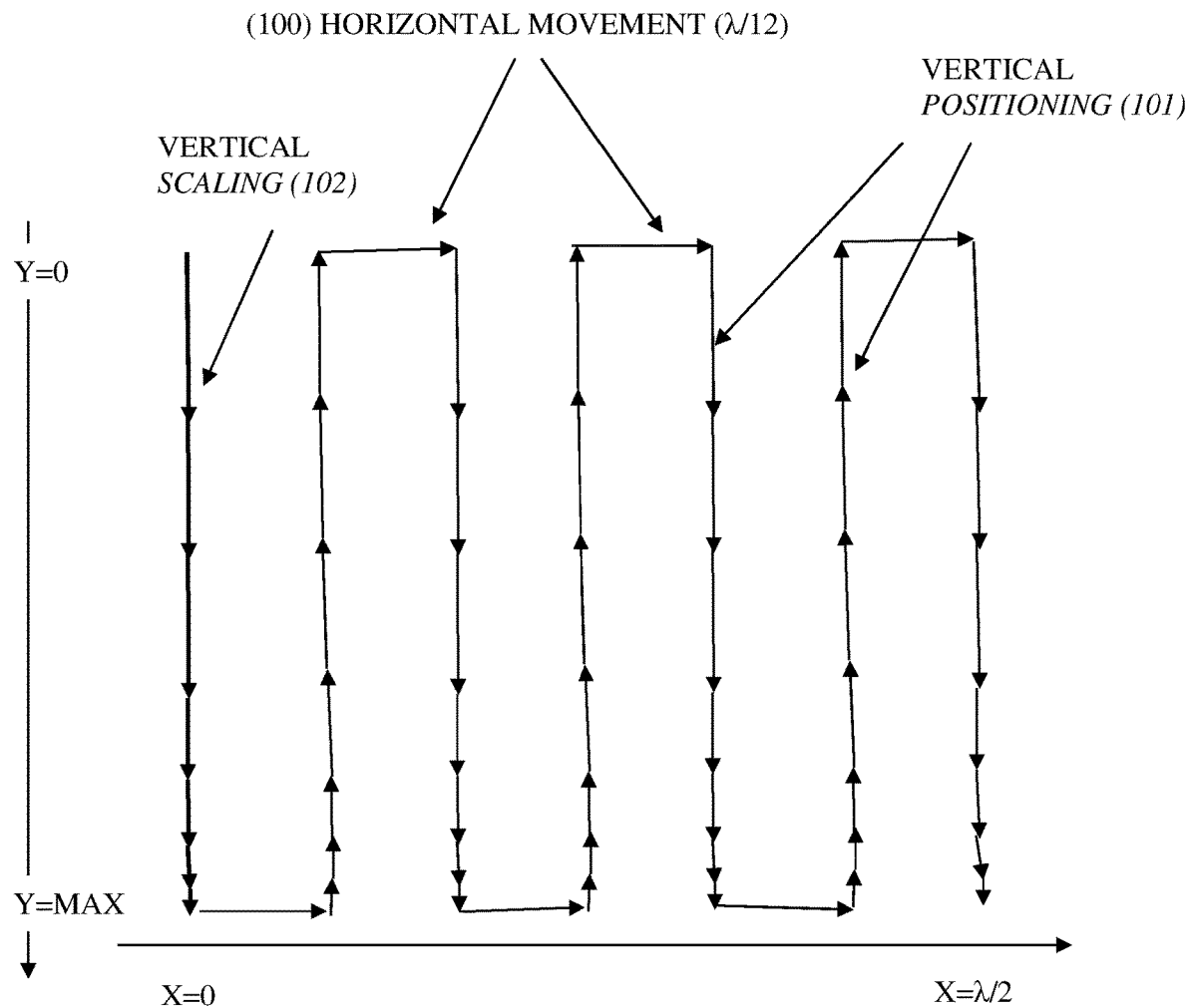
FIG. 10 depicts tuning probe trajectory for fast calibration with vertical positioning every 60 degrees (X=λ/12, λ/6, λ/4 ... λ/2).
Figures 14A, 14B:
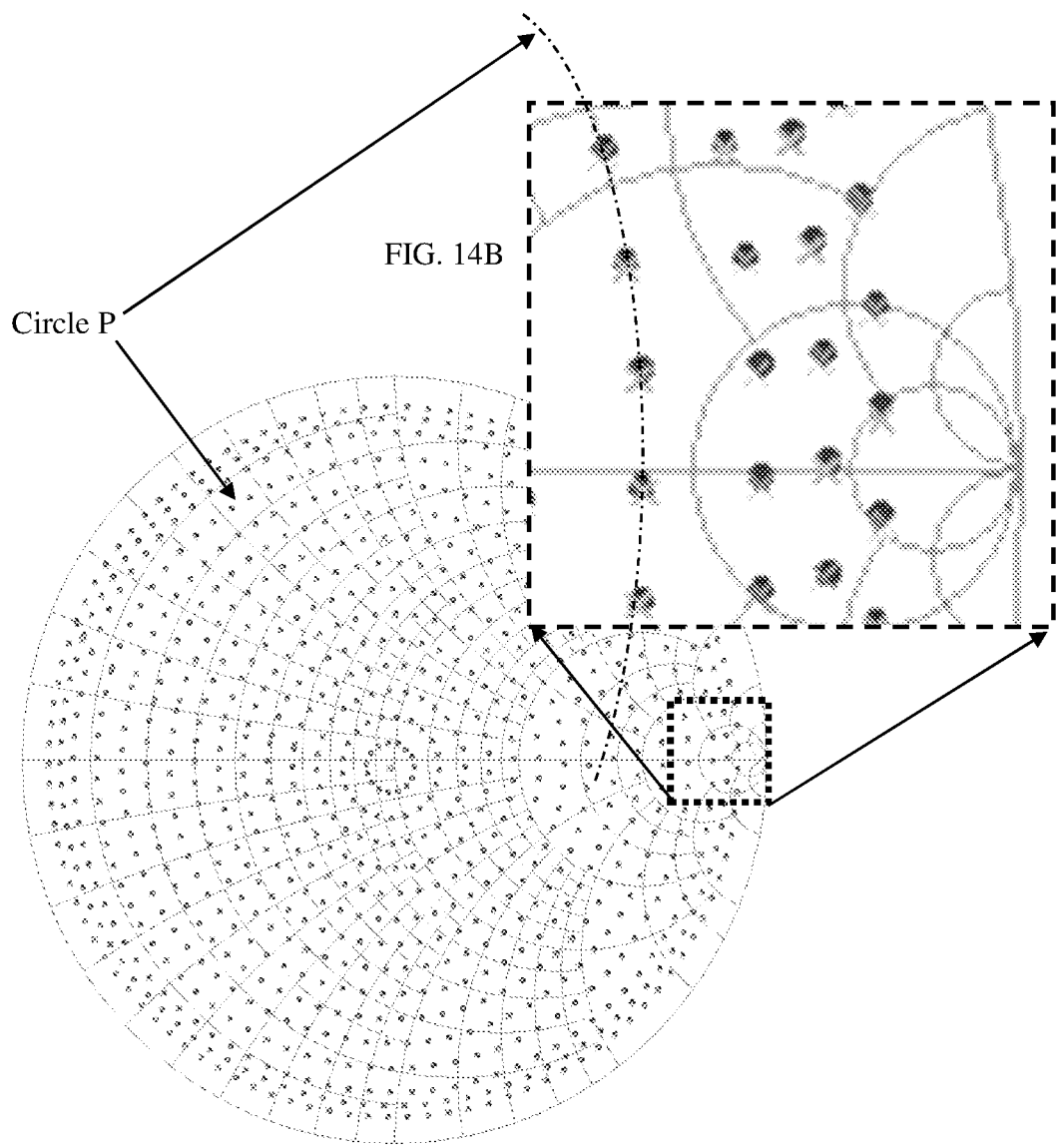
FIG. 14A through 14B depict full calibration and comparisons.

The new fast algorithm is a compromise between maximum accuracy and speed, taking advantage of the linear phase dependence of the phase of $S_{11}$ but introducing also enough reference points (FIG. 6) to compensate for the eccentricity of the circles in FIG. 4. The overall point distribution is shown in FIG. 5 and the probe trajectory in FIGS. 9 and 10. As can be seen from FIG. 6, the more reference points we have, the better can the bumpy trace (60) be fitted. FIG. 9 shows a total of 4 vertical moves (91), of which the first at X=0 and the last one at X=λ/2 overlap. After the scaling (92) we have (51)-type trajectories every 120 degrees (at 0, 120, 240 and 360 degrees) (91). Experiments, though, have shown that the accuracy, for a specific tuner, is not high enough, compared with a full calibration. Therefore, the number of vertical positioning sets (trajectories) (101) was increased (FIG. 10). Now the (51) type trajectories are every 60 degrees (0, 60, 120, 180, 240, 300 and 360 degrees). In this case the accuracy is enough for generating high density calibrations (FIGS. 14A and 14B). Therefore, the total calibration time is reduced from TS+1440 points to TS+60+30*6=TS+240 points. Herein TS is the scaling (92, 102) time and 60 is 6 vertical positioning sets for 10 vertical positions each. The number 30*6 describes, approximately, the travel time between vertical (51) type trajectories. In total a time saving of a factor 5 is possible and realistic.

Figure 13A:
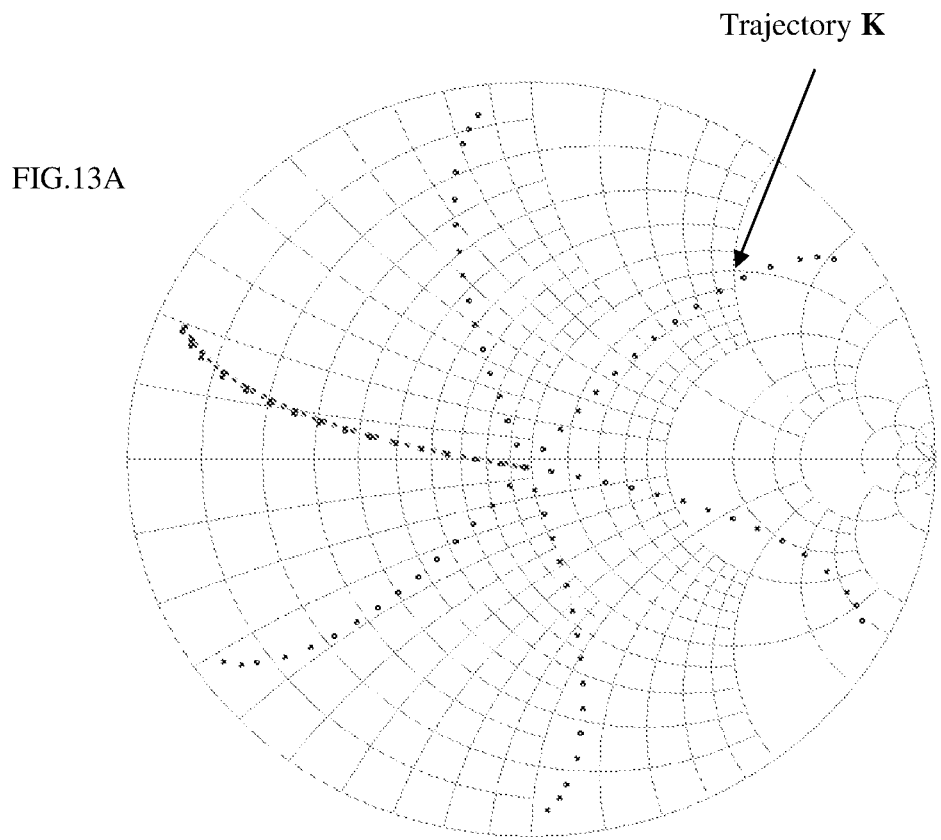
FIG. 13A through 13B depict scaling and accuracy of fast calibration.

The measured data of the fast calibration routine including scaling (50) and vertical positioning (51) is used to generate the full calibration data base (all other points in FIG. 5). The time saving is obvious. The generated reflection factor is $$S_{11}(X,Y) = |S_{11}(X,Y_j)| * \exp j * \Phi_{11}(X,Y_j) \quad \{eq.1\}$$

created using linear interpolation between adjacent points.

Wherein $X_j \leq X \leq X_{j+1}$. This equation generates all circles in FIG. 5 and FIG. 13B with an accuracy ranging between −50 dB and −42 dB (vector difference of 0.3% to 1%) for a set of measured radial trajectories every 60 degrees (FIG. 13A).

Figure 12A:
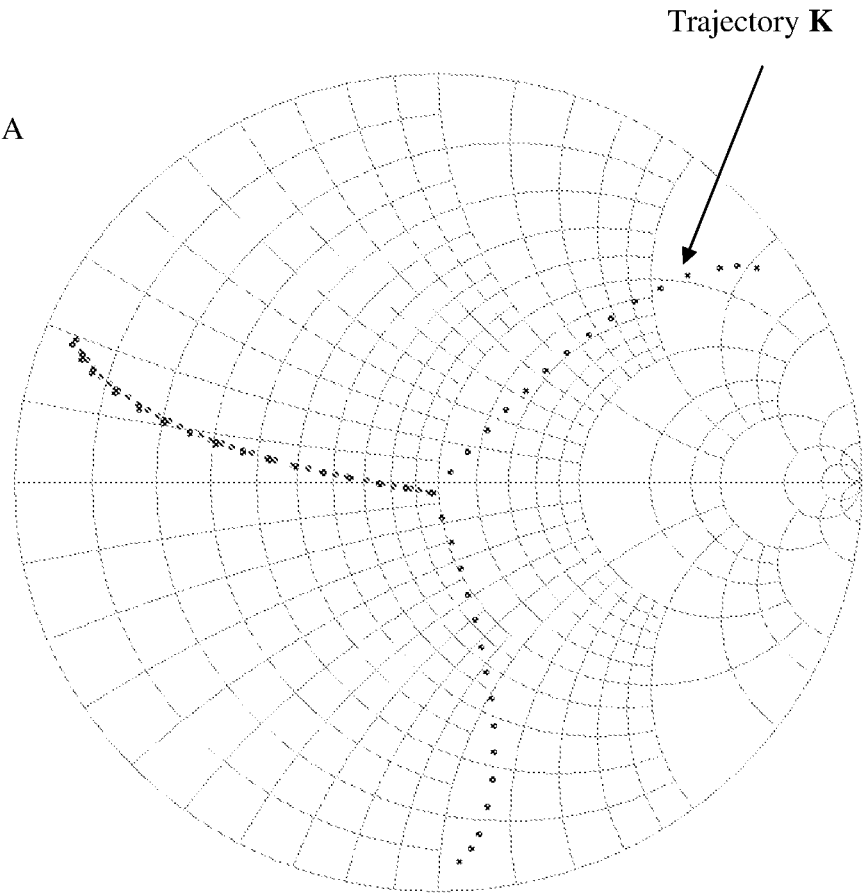
FIG. 12A through 12B depict scaling and accuracy of fast calibration.
Figure 12B:
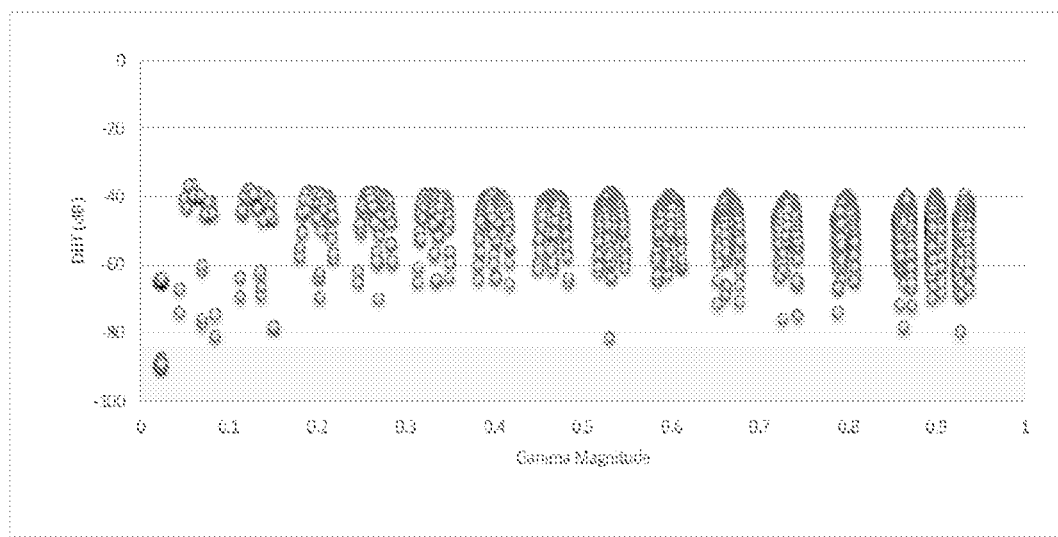
Figure 13B:
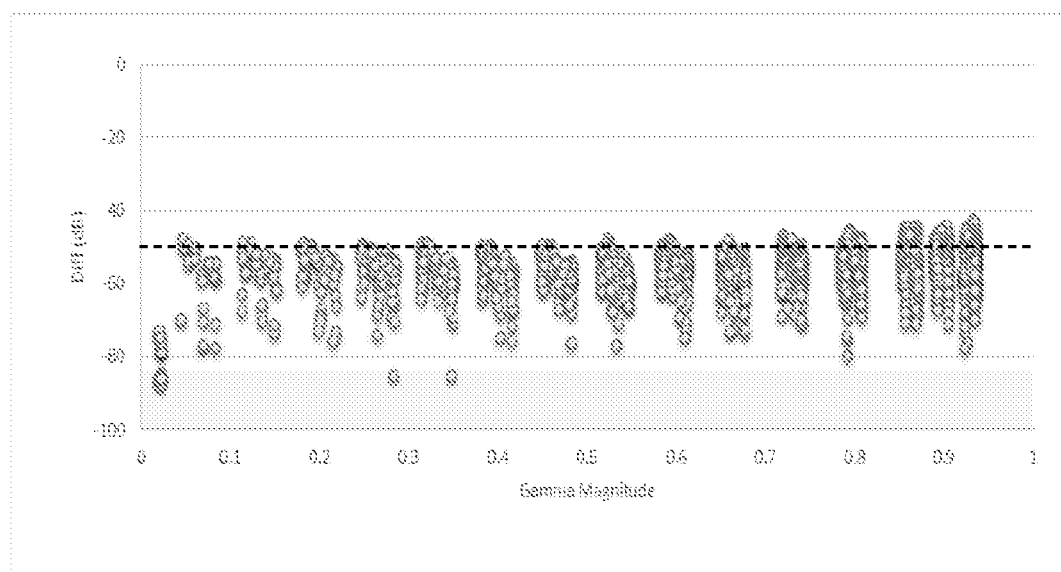

The accuracy data in FIGS. 12B and 13B correspond to the vector difference between numerically generated data using {eq. 2} and {eq. 3} and measured data. In that sense the calculated data in FIGS. 12B and 13B correspond to a physical model whereas the original full calibration data correspond to a behavior model. The generated data are a physical model, because in {eq. 1} we use the natural behavior of the phase of $S_{11}$ to be linearly proportional to X. The error in FIGS. 12B and 13B is calculated as Diff [dB]=20*log |$S_{11}$.calc−$S_{11}$.meas|, or a vector difference of 0.01 (1%) corresponds to −40 dB: Example: |$S_{11}$.calc|=0.9, |$S_{11}$.meas|=0.91.

The tuner two-port is best described using four complex two-port s-parameters $S_{ij}$ for $\{i,j\}=\{1,2\}$, $S_{ij}=|S_{ij}|*\exp(j*\Phi_{ij})$ expressed best in polar format, because the reflection factor natural behavior of the slide screw tuner is polar. In the tuner calibration the reflection factor $S_{11}$ at the test port, created by horizontal and vertical tuning probe movement, covers a large area of the disc shaped Smith chart. When the probe is inserted into the slabline slot and approaches the center conductor |$S_{11}$| increases slowly at the beginning and sharply and the end and the phase changes slightly. When the probe moves horizontally the amplitude of $S_{11}$ remains roughly constant and the phase changes proportional to the distance from the test port. The same is valid for the reflection factor $S_{22}$ seen into the idle port. The transmission factors $S_{21}$ (forward) and $S_{12}$ (reverse) keep their phase approximately constant during horizontal movement and decrease in amplitude as the probe penetrates.

Overall the s-parameters do not change rapidly, except for a rapid amplitude change, when the probe is very close to the center conductor. Therefore, given an appropriate grid of measured data points (FIG. 6) a linear interpolation between two adjacent data points yields acceptable calculated calibration data. Assuming M to be the number of vertical positioning trajectories or "scalings" (typically M=4, M=6 etc.) and N to be the number of concentric circles created for probe penetration Y=constant (typically N=5 to N=20) and K being the index of a vertical trajectory (VTRAJ) K=1, 2 . . . M and P the index of the circle (P=1 . . . N) on the specific (K) trajectory, in general terms then, for the test port reflection factor $S_{11}$ follows: The amplitude and phase of $S_{11}$ at position X on the circle P for (1≤P≤N) between vertical trajectories K and K+1 (1≤K≤M) is equal to $$|S_{11}(X,Y)| \approx |S_{11}(K,P)| + [|S_{11}(K+1,P)| - |S_{11}(K,P)|] * [X-X(K+1,P)]/[X(K+1,P)-X(K,P)]; \quad \{eq.\ 2\}$$

$$\Phi_{11}(X,Y) \approx \Phi_{11}[X(K),P] - 4\pi*[X-X(K)]/\lambda; \quad \{eq.\ 3\}$$

The amplitude and phase of reflection factor $S_{22}$ seen at the idle port are:

$$|S_{22}(X,Y)| \approx |S_{22}(K,P)| + [|S_{22}(K+1,P)| - |S_{22}(K,P)|] * [X-X(K+1,P)]/[X(K+1,P)-X(K,P)];$$

and $$\Phi_{22}(X,Y) \approx \Phi_{22}[X(K),Y(P)] + 4\pi*[X-X(K)]/\lambda;$$

The transmission coefficients $S_{21}=S_{12}$ are also generated using a linear interpolation between adjacent points in X and Y direction on the vertical K trajectories (FIG. 12A) and the P circles:

$$S_{12}(X,Y(P)) = S_{21}(X,Y(P)) \approx S_{21}(Y(P+1)) - S_{21}(Y(P))* [X-X(P)]/[X(P+1)-X(P)],$$

both in amplitude and phase. These relations have been used to generate the measured and calculated plots of FIGS. 12 to 14.

The tuner calibration can, obviously, execute also when a tuning probe is initialized, for whatever reason, diametrically to the hitherto description. In this case the probe starts the horizontal travel from the idle port and moves towards the test port. All above considerations hold with proper adaptation of the numeric values and signs. A slightly different situation occurs with the vertical movement, if the origin (Y=0) is set at the quasi mechanical contact of the probe with the center conductor. In this case the vertical scaling starts with very small steps (because of the high GAMMA sensitivity, and proceeds with increasing steps. As in the opposite situation both Y=0 and Y=Y.MAX must be user defined. The shortcoming of this second scaling algorithm is that the routine cannot decide automatically if any user-defined GAMMA.MAX is reached or not.

Although the present invention has been explained hereinabove by way of a preferred embodiment thereof, other combinations of the described components are possible and, as far as obvious to a person skilled in the art, they shall not limit the scope of the present invention.

What is claimed is:

1. A scaling algorithm as part of a calibration process of slide screw impedance tuners at a frequency F, said tuners having a slabline, a tuning probe, a test, and an idle port, comprises the following steps:
    (a) connect the impedance tuner to a pre-calibrated vector network analyzer between the test and idle ports;
    (b) enter a number of concentric circles N, a number of vertical trajectories M≥3 and a maximum reflection factor (Γmax);
    (c) initialize (withdraw from the slabline and place close to the test port) the tuning probe;
    (d) insert the tuning probe gradually vertically into a slot of the slabline and measure a reflection factor (|$S_{11}$|) at the test port;
    (e) save a set of (N+1) vertical positions Y(m) of the tuning probe and associated values of |$S_{11}$| between a minimum and a maximum value, wherein Y(m=0)=0, N>1 and 0≤m≤N.

2. A measurement procedure for the calibration process of slide screw impedance tuners, as in claim 1, at the frequency F, comprising the following steps:
    (a) initialize the tuning probe and set X=0, Y(0)=0, K=1;
    (b) move the tuning probe parallel to the slabline to X=K*λ(F)/(2M);
    (c) in a loop, move the tuning probe vertically to the set of (N+1) positions Y(m), measure s-parameters Sij(X (K),Y(m)) and save;
    (e) if (K≤M−1) {set K=K+1, go to step (b)};
    (f) else terminate.

3. An interpolation method for the calibration process of slide screw impedance tuners as in claim 1 or 2,
wherein
tuner s-parameters Sij(X,Y)=|Sij(X,Y)|*exp(j*Φij(X, Y)) are determined as follows:
(a) |$S_{11}$| and |$S_{22}$| are calculated as linear interpolation between adjacent |Sii(K,m)| and |Sii(K+1,m)|, for 0≤m≤N, i={1,2} and 0≤K≤M and saved;
(b) Φ11 and Φ22 are calculated as linear interpolation between adjacent |Φii(K,m)| and |Φii(K+1,m)|, for 0≤m≤N, i={1,2} and 0≤K<M and saved;
(c) S12=S21 are calculated as arithmetic average between adjacent S21(K,m) and S21(K+1,m), for 0≤m≤N, 0≤K<M, and saved.

4. The calibration process of slide screw impedance tuners as in claim 1, wherein the tuning probe is diametrically initialized (withdrawn from the slabline and placed close to the idle port).

5. The calibration process of slide screw impedance tuners as in claim 1, wherein the number of reflection factor circles N is between 5 and 20.

\* \* \* \* \*